United States Patent
Son et al.

(10) Patent No.: US 9,337,840 B2
(45) Date of Patent: May 10, 2016

(54) VOLTAGE LEVEL SHIFTER AND SYSTEMS IMPLEMENTING THE SAME

(71) Applicant: Samsung Electronics Co., Ltd., Suwon-si, Gyeonggi-do (KR)

(72) Inventors: Jin Seung Son, Austin, TX (US); Prashant Kenkare, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 341 days.

(21) Appl. No.: 13/897,264

(22) Filed: May 17, 2013

(65) Prior Publication Data
US 2014/0340119 A1 Nov. 20, 2014

(51) Int. Cl.
*H03K 19/0175* (2006.01)

(52) U.S. Cl.
CPC ............................ *H03K 19/017509* (2013.01)

(58) Field of Classification Search
None
See application file for complete search history.

(56) References Cited

U.S. PATENT DOCUMENTS

| | | | | |
|---|---|---|---|---|
| 4,797,583 | A * | 1/1989 | Ueno et al. | 326/66 |
| 5,559,464 | A * | 9/1996 | Orii | H03K 17/102 326/80 |
| 6,127,848 | A * | 10/2000 | Wert et al. | 326/81 |
| 6,259,299 | B1 * | 7/2001 | Ryu | 327/333 |
| 6,870,229 | B2 * | 3/2005 | Dessard et al. | 257/360 |
| 7,511,554 | B2 * | 3/2009 | Kaneko | H03K 19/01812 326/63 |
| 7,705,631 | B2 * | 4/2010 | Chen | G11C 5/145 326/68 |
| 8,373,486 | B2 * | 2/2013 | Ficke | H03L 9/00 326/62 |
| 8,629,705 | B2 * | 1/2014 | Chang | H02M 3/07 327/333 |
| 2004/0104756 | A1 * | 6/2004 | Payne | 327/333 |
| 2005/0237099 | A1 * | 10/2005 | Tachibana et al. | 327/333 |
| 2006/0006908 | A1 * | 1/2006 | Chung | 326/80 |

* cited by examiner

*Primary Examiner* — Alexander H Taningco
*Assistant Examiner* — Nelson Correa
(74) *Attorney, Agent, or Firm* — Renaissance IP Law Group LLP

(57) ABSTRACT

According to the inventive concepts disclosed herein, a level shifter can include an input node in a first voltage domain and an output node in a second voltage domain, higher than the first voltage domain. The input node receives an input signal in the first, lower-voltage domain, and the output node is configured to output a representation of the input signal in the second, higher-voltage domain. A lower-voltage control circuit can control a supply of the lower-voltage level to a boundary node arranged at a boundary between the first and second domains. A higher-voltage control circuit can also be provided to control a supply of the higher-voltage level to the boundary node. The lower-voltage control circuit can cut off the lower-voltage supply to the boundary node when the higher-voltage control circuit supplies the higher-voltage level to the boundary node. The higher-voltage control circuit can, for instance, include logic circuitry that enables and disables a connection to the higher-voltage supply. Alternatively, the higher-voltage control circuit can include a boost capacitor coupled between the output node and the boundary node.

16 Claims, 7 Drawing Sheets

VOLTAGE LEVEL SHIFTER AND SYSTEMS IMPLEMENTING THE SAME

BACKGROUND

The inventive concepts described herein relate to supply voltage scaling techniques, and more particularly, to voltage level shifters and systems implementing voltage level shifters.

The most effective low-power technique for electronic systems is supply voltage scaling. However, System on Chip (SOC)/Central Processing Unit (CPU) supply voltage scaling may be limited in some designs by the minimum voltage requirements in Static Random Access Memory (SRAM) devices (i.e., SRAM Vmin). This may particularly be the case with high-density SRAM bit cells. In order to overcome SRAM Vmin limitations and still produce a low-power device, a dual-supply design (DSD) technique has been implemented, in which a first conditionally lower voltage domain (VDD1 or VDDL (Logic VDD)) is used for logic circuits, and a second, higher voltage domain (VDD2 or VDDS (SRAM VDD)) is used for the SRAM cells. This DSD technique requires a transition (i.e., level shifting) from the lower voltage domain to the higher voltage domain. In contrast, the transition in the other direction (from the higher voltage domain to the lower voltage domain) can occur transparently without an explicit level shifter circuit.

A conventional method for transitioning from the lower-voltage logic section to the higher-voltage SRAM macro is to insert explicit voltage level shifters into the circuit at the SRAM input boundary. Unfortunately, this method has two primary disadvantages. First, the insertion of explicit voltage level shifters increases the signal delay for signals transitioning from the lower-voltage domain to the higher-voltage domain. The second disadvantage is the increased power requirements for the SRAM peripheral circuits located in the higher-voltage domain rather than the lower-voltage domain.

In an alternative approach, illustrated in FIG. 1 for example, a DSD technique may use a simple inverter level-shifter to transition between the lower-voltage (VDD1) and the higher-voltage (VDD2) domains. In this approach, most of the peripheral circuits as well as the bit lines can be arranged in the lower-voltage (VDD1) domain for power saving. FIG. 2 is a schematic signal diagram illustrating various signals passing through the inverters of FIG. 1. As illustrated in FIG. 2, this inverter level-shifter design can transition a signal voltage from the lower-voltage (VDD1) level to the higher-voltage (VDD2) level. Unfortunately, however, in this technique, the amount of logic VDD scaling may be limited due to problems with leakage current.

More specifically, referring now to FIG. 1A, the lower-voltage (VDDL) level is typically limited to at most around 200 mV below the higher-voltage (VDDH) level. Otherwise, leakage current can undesirably increase because the PMOS transistor 12 arranged at the voltage domain boundary may be weakly turned on when the input voltage ($V_{OH}$) from the lower-voltage (VDDL) domain is high, but still less than the higher-voltage (VDDH) level (i.e., not high enough to completely turn off the PMOS transistor 12). In other words, if the difference between voltages in the two domains (VDDH and VDDL) is too great, the PMOS transistor 12 in the inverter i3 arranged at the boundary between the two voltage domains will not shut-off completely and a leakage current $I_{Leak}$ will flow through the transistor 12. This power loss can dramatically reduce the power saving benefits of the DSD circuit. It would therefore be desirable to have a voltage-level shifter design that overcomes these drawbacks.

SUMMARY

Embodiments incorporating principles of the present inventive concepts provide a simple and efficient voltage-level shifter capable of use in a wide variety of systems and devices.

According to one aspect of the present inventive concepts, a voltage-level shifter for transitioning a signal between a lower-voltage domain and a higher-voltage domain can include an input configured to receive an input signal in a lower-voltage domain and an output configured to output a higher-voltage representation of the input signal in a higher-voltage domain. A low-voltage control circuit is preferably included to selectively disable a low-voltage supply to a boundary node between the lower and higher-level voltage domains in response to a high-level input signal. A higher-voltage control circuit is also preferably provided to selectively provide a higher-level voltage to the boundary node in response to the high-level input signal.

In one embodiment, the higher-voltage control circuit comprises a logic circuit and gates configured to shut off the higher-level voltage supply to the boundary node in response to a low-level input signal, and turn on the higher-level voltage supply in response to a high-level input signal. More specifically, the logic circuit and gates can include a NAND gate and two PMOS transistors. Of course, any other logic circuit and/or one or more gates that perform the same or equivalent function could be used.

In another embodiment, the higher-voltage control circuit can comprise a boost capacitor configured to boost the voltage level at the boundary node to a higher-level voltage in response to a high-level input signal. This embodiment may be particularly useful in applications with high-level input signals of relatively short durations, such as pulse signals. High-level signals with too long a duration could drain the capacitor below its ability to provide the higher-level voltage to the boundary node. Again, other mechanisms for temporarily boosting the voltage level at the boundary node in response to a high-level input signal are also possible, and should be considered within the spirit and scope of the present inventive concepts.

BRIEF DESCRIPTION OF THE DRAWINGS

The principles of the present inventive concepts will now be described in greater detail with reference to the attached drawings, in which.

DETAILED DESCRIPTION OF THE EMBODIMENTS

Figure 1:
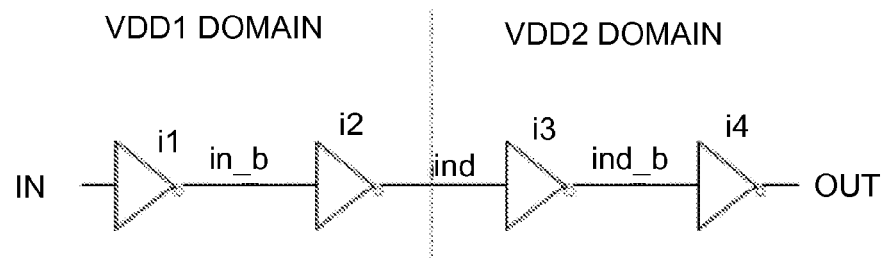
FIG. 1 is a schematic circuit diagram illustrating a conventional inverter-based voltage-level shifter.

The principles of the present inventive concepts will now be described more fully hereinafter with reference to the accompanying drawings, in which exemplary embodiments incorporating principles of the inventive concepts are shown. It should be noted, however, that the inventive concepts are not limited to the following exemplary embodiments, and may be implemented in various forms. Accordingly, the exemplary embodiments are provided only to disclose the inventive concepts and assist those skilled in the art in understanding them. Furthermore, embodiments of the inventive concepts are not limited to the specific examples shown in the drawings and features thereof are not necessarily shown to scale.

The terminology used herein to describe these particular embodiments is not intended to limit the inventive concepts. As used herein, the singular terms "a," "an" and "the" are intended to include the plural forms as well, unless the context clearly indicates otherwise. As used herein, the term "and/or" includes any one and any and all combinations of the associated listed items. It will be understood that when an element is referred to as being "connected" or "coupled" to another element, it may be directly connected or coupled to the other element or intervening elements may be present.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It will be also understood that although the terms first, second, third, etc., may be used herein to describe various elements, the elements should not be limited by these terms. Rather, these terms are only used to distinguish one element from another element. Thus, a first element in some embodiments could be termed a second, third, etc., element in other embodiments (and vice versa) without departing from the teachings of the present inventive concepts. Exemplary embodiments of aspects of the present inventive concepts explained and illustrated herein include their complementary counterparts. The same reference numerals or the same reference designators denote the same elements throughout the specification.

Figure 1A:
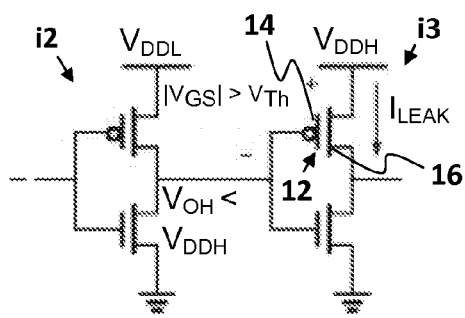
FIG. 1A is a schematic circuit diagram of a portion of the inverter-based voltage-level shifter of FIG. 1, illustrating a leakage current problem associated with the conventional art.
Figure 2:
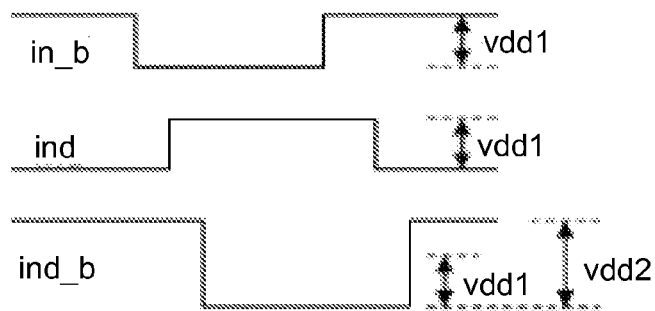
FIG. 2 is a timing chart schematically illustrating signals passing through various nodes in the inverter-based voltage-level shifter of FIG. 1.

FIGS. 1 and 1A are schematic circuit diagrams illustrating a conventional simple inverter voltage level-shifter scheme. FIG. 2 is a schematic timing chart illustrating the signal timings for signals at various nodes in the voltage-level shifter of FIG. 1. Referring to FIGS. 1, 1A, and 2, in a simple inverter voltage level-shifter scheme, the voltage domain changes from VDD1 to VDD2 without an explicit level shifter circuit arranged between the inverters (i2 and i3) on opposite sides of the boundary node (ind).

Although this circuit design provides benefits in terms of area and design simplicity, the PMOS 12 of the inverter (i3) at the boundary between the two voltage levels may not be turned off completely when the boundary node (ind) is at a high (H) logic state, due to a voltage level difference between VDD1 (or VDDL) and VDD2 (or VDDH). In other words, the PMOS 12 of the inverter (i3) at the boundary node (ind) may be slightly turned on when the signal at the boundary node (ind) is at a logic-high state (H), because the gate 14 of the PMOS is at the lower voltage (VDDL or VDD1) level while the drain 16 is at the higher voltage (VDDH or VDD2) level.

Accordingly, when the boundary node (ind) is at H state due to a high-level input signal, since the PMOS 12 of the inverter (i3) at the boundary node is not turned off completely, lowering the lower-voltage (VDD1) level will increase the leakage current through the PMOS 12 and can therefore cause a meta-stability issue. In low power designs with multiple power domains, this is therefore a significant limitation with respect to the ability to lower the lower-voltage (VDD1) level when using a simple inverter voltage-level shifter according to the conventional art.

Figure 3:
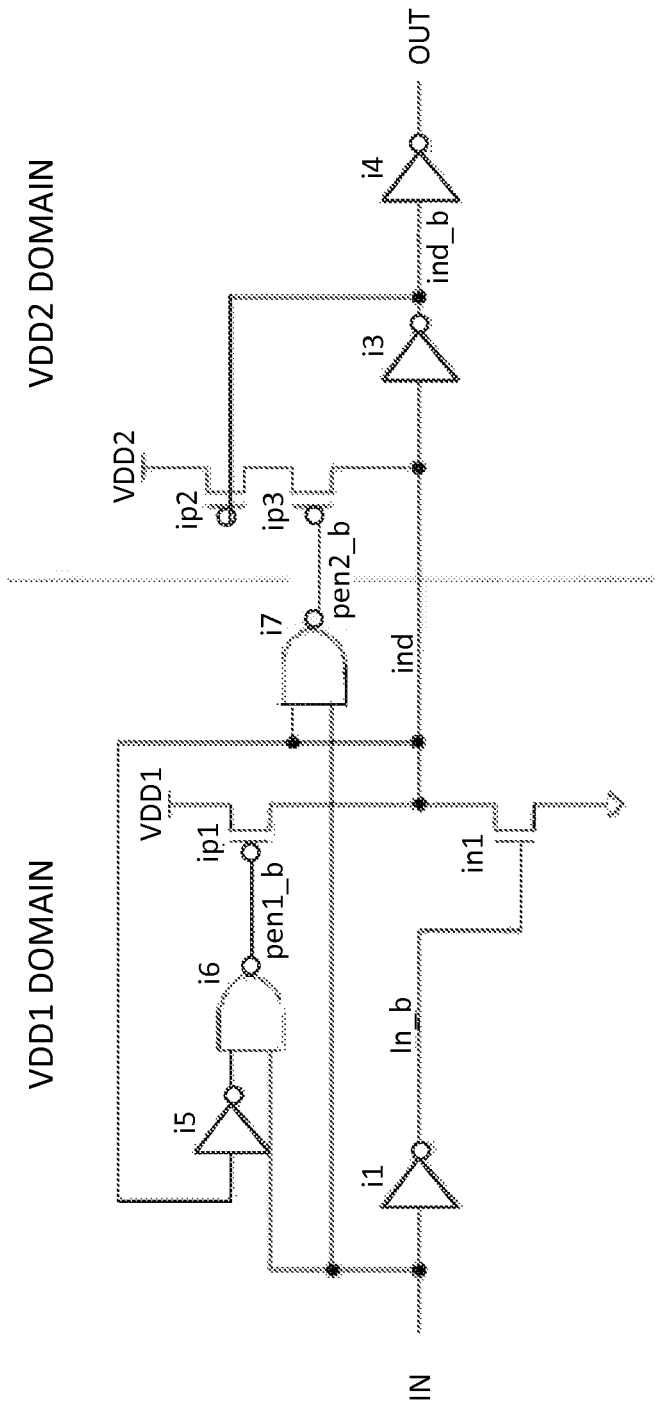
FIG. 3 is a schematic circuit diagram illustrating a voltage-level shifter constructed according to one embodiment incorporating principles of the present inventive concepts.
Figure 4:
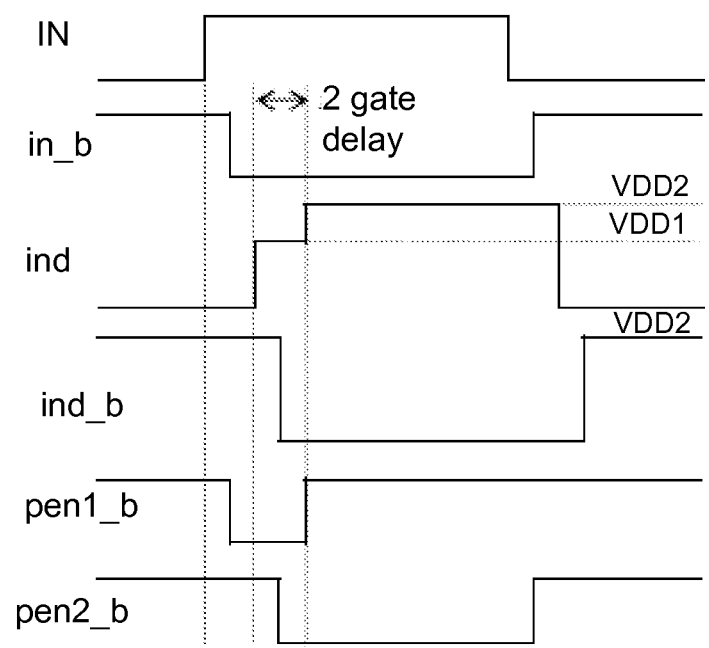
FIG. 4 is a timing chart schematically illustrating signals passing through various nodes of the voltage-level shifter of FIG. 3.

FIG. 3 is a schematic circuit diagram illustrating a voltage-level shifter constructed according to one embodiment incorporating principles of the present inventive concepts; and FIG. 4 is a timing chart schematically illustrating signals passing through various nodes of the voltage-level shifter of FIG. 3.

Referring now to FIGS. 3 and 4, when the input signal (IN) transits to a high-logic state (H), the boundary node (ind), where the lower-voltage (VDD1) and higher-voltage (VDD2) domains meet, is initially pulled up to the lower-voltage (VDD1) level by the signal (in_b) from the first inverter (i1). The first inverter (i1) is connected to a gate of the transistor (in1), which can be controlled by the signal (in_b) from the first inverter (i1). After a short delay (e.g., a few gates), the voltage level at the boundary node (ind) gets pulled up to the higher-voltage (VDD2) level by turning off the first transistor (ip1) in a lower-voltage control circuit and by turning on the second and third transistors (ip2 and ip3, respectively) in a higher-voltage control circuit.

More specifically, the lower-voltage control circuit can, for instance, include a NAND gate (i6) receiving as inputs the input signal (IN) and an inverted signal from the boundary node (ind) through an inverter (i5). The output of the NAND gate (i6) can then be connected to the gate of the first transistor (ip1). In this manner, the first transistor (ip1) is turned off by the pen1_b signal, which is produced by nand-gating the input signal (IN) and the inverted signal of the boundary node (ind). The source of the first transistor (ip1) can be connected to the lower-voltage (VDD1) supply and the drain can be connected to the boundary node (ind).

The higher-voltage control circuit can, for instance, include a NAND gate (i7) and two transistors (ip2 and ip3). The second transistor (ip2) can be connected to the output of the boundary node inverter (i3) such that it is turned on by a low level (L) output signal (ind_b) from the inverter (i3) (e.g., which is discharged to ground when the boundary node (ind) is high (H)). The inverter (i4) can invert the output signal (ind_b) to produce an output signal at the output node (OUT). The NAND gate (i7) can receive as inputs the input signal (IN) and the signal (ind) at the boundary node. The third transistor (ip3) can have its gate connected to receive the output signal pen2_b from the NAND gate (i7), such that the third transistor (ip3) is turned on by nand-gating the input signal (IN) and the boundary node signal (ind). The third transistor (ip3) can have its source connected to the drain of the second transistor (ip2) and its drain connected to the boundary node (ind).

Using this design, the boundary node (ind) can be level shifted from the lower-voltage (VDD1) domain to the higher-voltage (VDD2) domain, by turning off the lower-voltage (VDD1) supply of the previous stage inverter using the lower-voltage control circuit and by turning on the higher-voltage (VDD2) supply using the higher-voltage control circuit to thereby raise the voltage level of the boundary node (ind). The reason for turning off the voltage supply from the lower-voltage (VDD1) supply through the lower-voltage control circuit is to prevent a short circuit current path when the higher-voltage (VDD2) control circuit is turned on. In other words, if the lower-voltage (VDD1) supply isn't disconnected from the boundary node (ind) when the higher-voltage (VDD2) supply is connected, then current would flow from the higher voltage (VDD2) to the lower voltage (VDD1). Specifically, in this embodiment, if the first transistor (ip1) wasn't turned off, the short circuit current path would be:

VDD2→ip2→ip3→ip1→VDD1.

Again, in the conventional circuit shown in FIG. 1, the PMOS 12 of the boundary node inverter (i3) isn't turned off completely because the boundary node (ind) is not pulled up to the higher-voltage (VDD2) level. In this embodiment, this issue is resolved by using a lower-voltage control circuit to shut off the voltage supply to the boundary node from the lower-voltage (VDD1) supply (e.g., by turning off the first PMOS (ip1) of the first voltage domain (VDD1)), and using a higher-voltage control circuit to supply the higher-voltage (VDD2) level to the boundary node (ind) (e.g., by turning on the second and third PMOS transistors (ip2 and ip3) of the higher-voltage domain). Accordingly, since the boundary node (ind) voltage level is pulled up to the higher-voltage (VDD2) level, the PMOS gate of the inverter (i3) at the boundary node (ind) is turned off completely.

Figure 5:
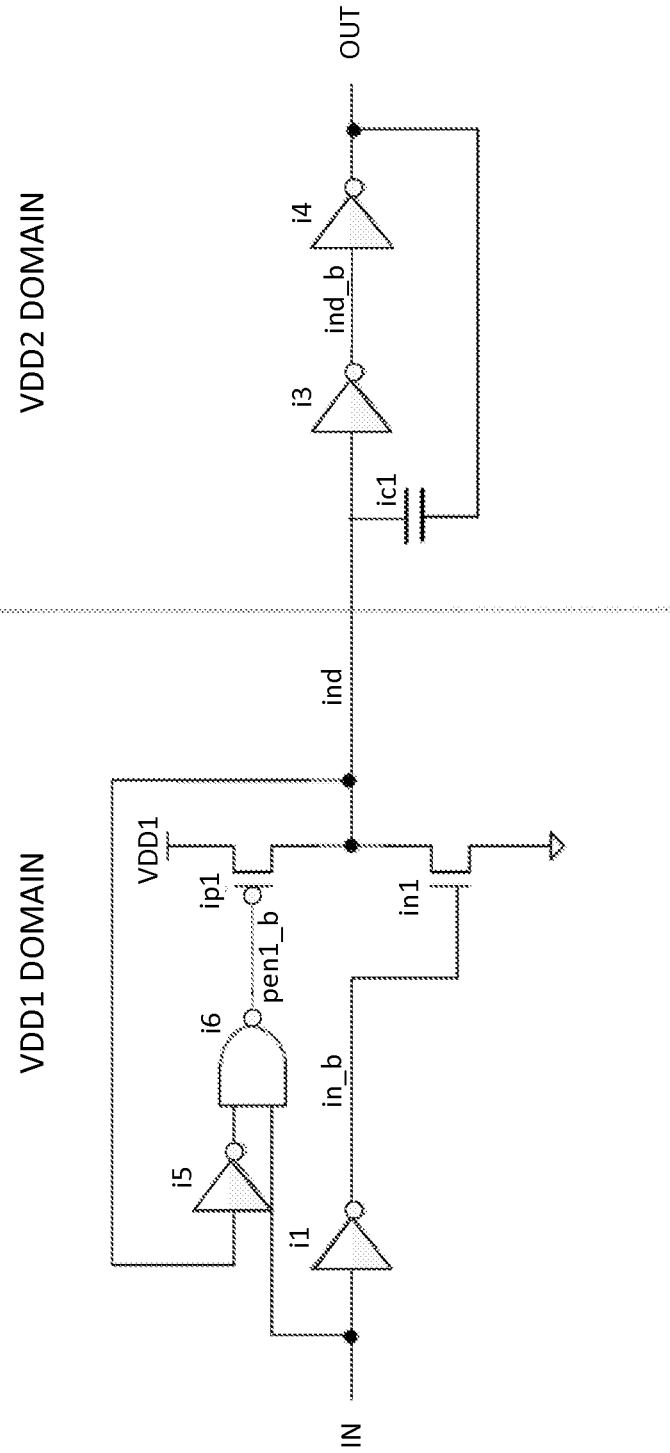
FIG. 5 is a schematic circuit diagram illustrating a voltage-level shifter constructed according to another embodiment incorporating principles of the present inventive concepts.
Figure 6A:
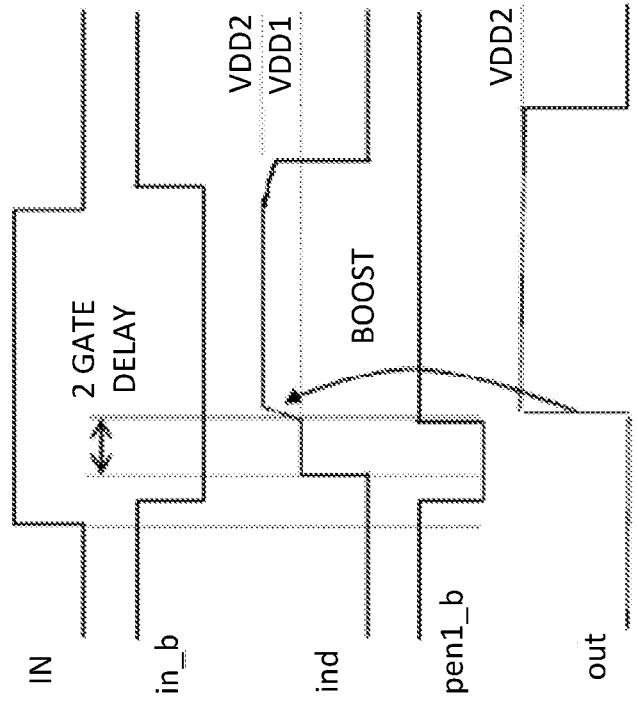
FIGS. 6 and 6A are timing charts schematically illustrating signals passing through various nodes of the voltage-level shifter of FIG. 5.
Figure 6:
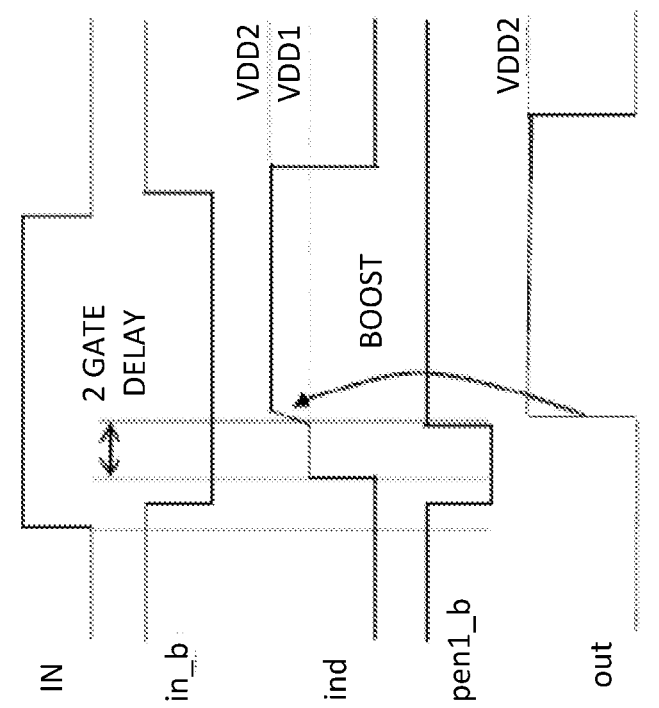

FIG. 5 is a schematic circuit diagram illustrating a voltage-level shifter constructed according to another embodiment incorporating principles of the present inventive concepts. FIGS. 6 and 6A are timing charts schematically illustrating signals passing through various nodes of the voltage-level shifter of FIG. 5.

Referring now to FIGS. 5 and 6, an alternative embodiment incorporating principles of the present inventive concepts will be explained. As in the previous embodiment, when the pulsed input signal transits to a high-level (H), the boundary node (ind) is pulled up to the lower-voltage (VDD1) level by normal inverter operation as in the conventional art. And again, like the prior embodiment and unlike the conventional art, the lower-voltage control circuit disconnects the lower-voltage (VDD1) supply from the boundary node as the boundary node signal transitions to the high (H) level. Unlike the earlier embodiment, however, rather than connecting the boundary node to the higher-voltage (VDD2) supply through logic circuitry, a boost capacitor (ic1) is connected between the output node (OUT) and the boundary node (ind) to temporarily boost the voltage level at the boundary node. The inverter (i4) can invert the output signal (ind_b) to produce an output signal at the output node (OUT). More specifically, by turning off the first transistor (ip1) in the lower-voltage control circuit and using a boost capacitor (ic1) which is driven by the output signal, the boundary node (ind) is boosted up to the higher-voltage (VDD2) level.

As in the previous embodiment, the lower-voltage control circuit can include a NAND gate (i6) having inputs coupled to the input node and to the boundary node through an inverter (i5). The first inverter (i1) is connected to a gate of the transistor (in_1), which can be controlled by the signal (in_b) from the first inverter (i1). The output (pen1_b) is connected to a gate of the first transistor (ip1). Accordingly, the transistor (ip1) is turned off by the pen1_b signal, which is produced by nand-gating the input signal and the inverted boundary node signal.

The high-voltage control circuit, however, is simply a boost capacitor (ic1) connected between the output node (OUT) and the boundary node (ind). In this embodiment, therefore, considering noise on the output signal, the boost capacitor (ic1) can be driven by a signal buffered internally from the boundary node (ind).

This boosting scheme is primarily useful with respect to pulsed input signals, where the pulse width is reasonably short enough to prevent the boundary node (ind) node from being discharged below the trip point of the inverter (i3) during the 'H' phase of the input signal. The signal timing diagram in FIG. 6A illustrates the voltage drop-off at the boundary node (ind) if the signal width is too long.

In this embodiment, the reason to shut off the lower-voltage (VDD1) supply using the lower-voltage control circuit is to prevent the boosted boundary node (ind) from being discharged to the lower-voltage (VDD1) level.

In this embodiment, the current leakage problem of the prior art is avoided by turning off the first transistor (ip1) in the first voltage domain (VDD1), and boosting the voltage level at the boundary node (ind) to the higher-voltage (VDD2) level using the coupling capacitor (ic1) driven by the output signal (OUT).

As with the previous embodiment, a significant benefit of this design is that the lower-voltage (VDD1) level can be made lower than in the conventional art, which can be extremely beneficial in low power designs.

Figure 7:
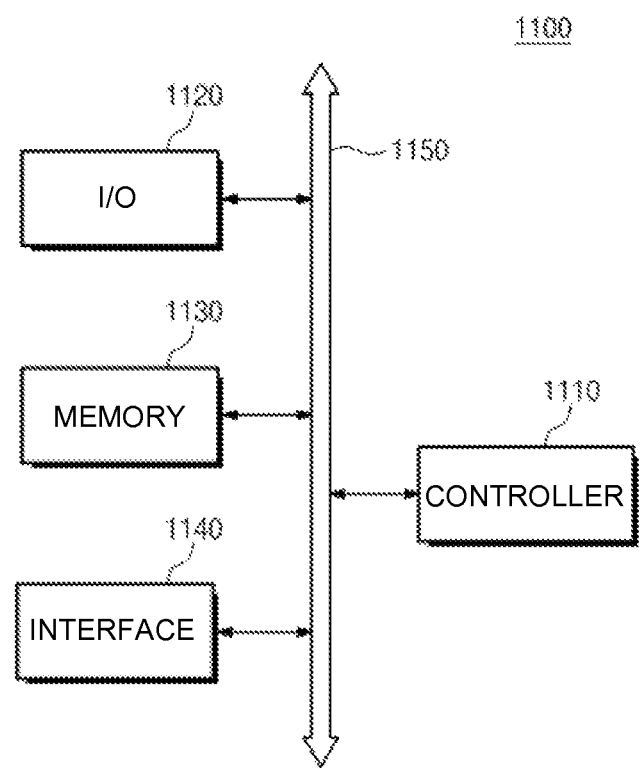
FIG. 7 is a schematic block diagram illustrating an example of a memory system including one or more voltage-level shifters formed according to principles of the present inventive concepts.

FIG. 7 is a schematic block diagram of a memory system illustrating one example of a system which can include a voltage level shifter formed according to principles of the inventive concepts.

Referring to FIG. 7, an electronic system 1100 according to embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include at least one of the semiconductor devices constructed according to embodiments of the inventive concepts.

The controller 1110 may include at least one of a microprocessor, a digital signal processor, a microcontroller, and other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The interface unit 1140 may transmit electrical data to a communication network or may receive electrical data from the communication network. The interface unit 1140 may operate wirelessly or via one or more wires or cables. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be utilized for instance, in a personal digital assistant (PDA), a portable computer, a web tablet, a wireless phone, a mobile phone, a digital music player, a memory card or other electronic products. The other electronic products may also receive or transmit information data by wireless communication.

Figure 8:
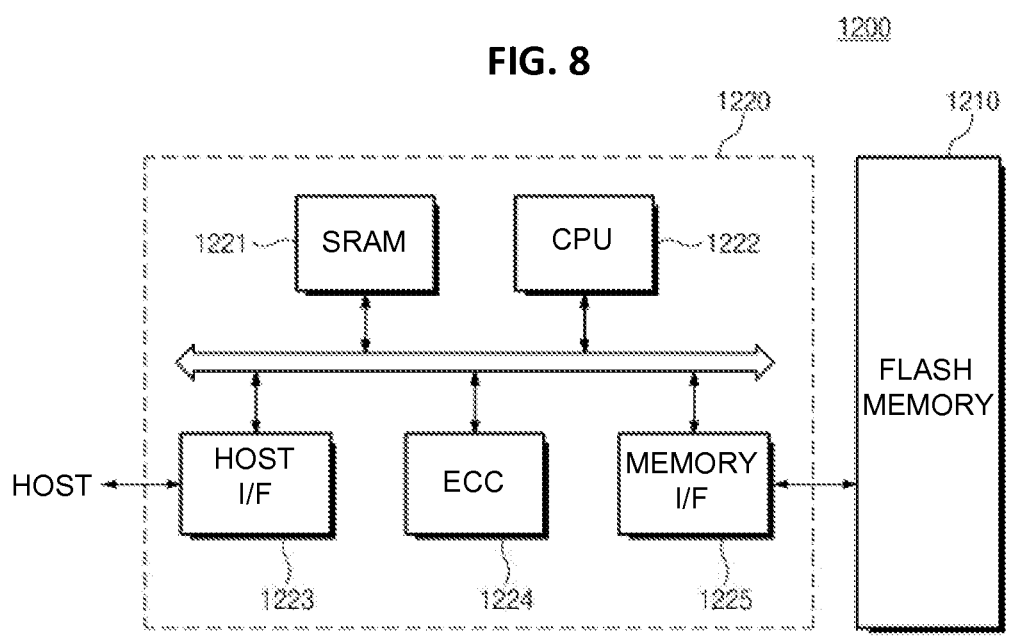
FIG. 8 is a schematic block diagram illustrating an example of a memory card including one or more voltage-level shifters formed according to principles of the present inventive concepts.

FIG. 8 is a schematic block diagram of a memory card illustrating a memory card embodiment which could include one or more voltage level shifters formed according to principles of the present inventive concepts.

Referring to FIG. 8, a memory card 1200 may include a memory device 1210. The memory device 1210 may include at least one of the semiconductor devices constructed according to the aforementioned embodiments. The memory device 1210 may further include other types of semiconductor memory devices (e.g., a DRAM device and/or a SRAM device) which are different from the semiconductor devices constructed according to the embodiments described above. The memory card 1200 may include a memory controller 1220 that controls data communication between a host and the memory device 1210. The memory device 1210 and the memory controller 1220 may include a semiconductor device constructed according to principles of the inventive concepts.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210.

Although not shown in the drawings, the memory card 1200 may further include a read only memory (ROM) device that stores code data to interface with the host. The memory card 1200 may be used as a portable data storage card. Alternatively, the memory card 1200 may be implemented as a solid state disk (SSD) used as a hard disk for a computer system.

Figure 9:
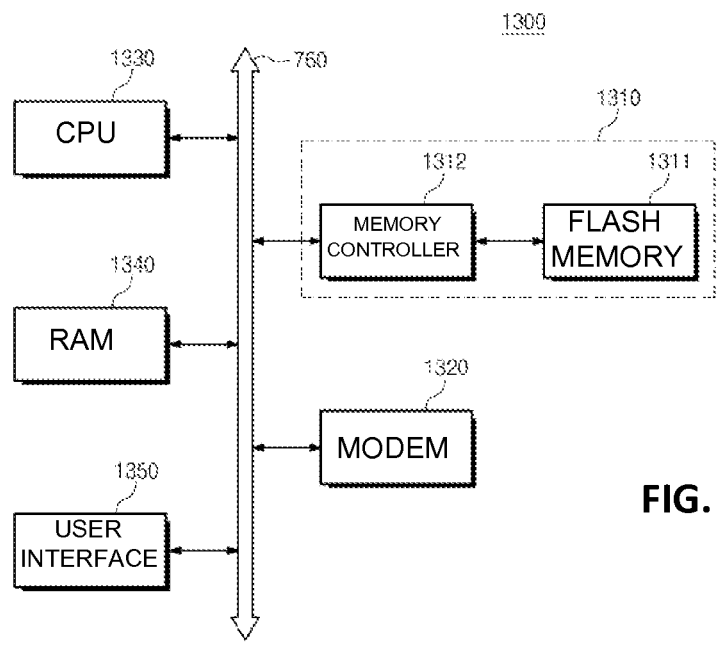
FIG. 9 is a schematic block diagram illustrating an example of an information processing system including one or more voltage-level shifters formed according to principles of the present inventive concepts.

FIG. 9 is a schematic block diagram of an information processing system 1300 which may include semiconductor devices formed according to principles of the inventive concepts.

Referring to FIG. 9, a flash memory system 1310 which includes one or more of the semiconductor devices constructed according to the principles of the present inventive concepts may be installed in an information processing system 1300 such as a mobile device or a desk top computer. The information processing system 1300 according to the inventive concepts may further include a modem 1320, a central processing unit (CPU) 1330, a random access memory (RAM) 1340, and a user interface unit 1350 that are electrically connected to the flash memory system 1310 through a system bus 1360. The flash memory system 1310 may be the same as the aforementioned memory card. Data processed by the CPU 1330 or data inputted from outside of the flash memory system 1310 may be stored in the flash memory system 1310.

The flash memory system 1310 may be a solid state disk (SSD) and the information processing system 1300 may stably store massive amounts of data in the flash memory system 1310. Additionally, since the reliability of the flash memory system 1310 is high, the flash memory system 1310 may reduce resources otherwise consumed for correcting errors. Thus, it is possible to realize an information processing system 1300 having a fast data exchange function. Even though not shown in the drawings, an application chipset and/or a camera image processor (CIS) used as an input/output unit may further be provided in the information processing system 1300.

The semiconductor devices described above may be encapsulated using various packaging techniques. For example, semiconductor devices constructed according to principles of the present inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique, a wafer-level processed stack package (WSP) technique, or other technique as will be known to those skilled in the art.

According to the inventive concepts, it is possible to reduce the lower-voltage (VDD1) level below that of the conventional art. Thus, additional power savings may be achieved.

While the principles of the inventive concepts have been described with reference to example embodiments, it will be apparent to those skilled in the art that various changes and modifications may be made thereto without departing from the spirit and scope of these inventive concepts. Therefore, it should be understood that the above embodiments are not limiting, but are illustrative only. Thus, the scope of the inventive concepts are to be determined by the broadest permissible interpretation of the following claims and their equivalents, and should not be restricted or limited by the foregoing description.

What is claimed is:

1. A level shifter for transitioning a signal between a lower-voltage domain and a higher-voltage domain, said level shifter comprising:
    an input node configured to receive an input signal in a lower-voltage domain;
    an output node configured to output a higher-voltage representation of the input signal in a higher-voltage domain;
    a lower-voltage control circuit configured to selectively disable a lower-voltage supply from supplying a lower-voltage to a boundary node arranged at a boundary between the lower-voltage domain and the higher-voltage domain in response to a high-level input signal; and
    a higher-voltage control circuit configured to selectively raise a voltage level at the boundary node in response to the high-level input signal,
    wherein the higher-voltage control circuit comprises a boost capacitor configured to boost the voltage level at the boundary node in response to a high-level input signal, and
    wherein the boost capacitor is connected between the output node and the boundary node.

2. The level shifter of claim 1, wherein the lower-voltage control circuit comprises logic circuitry configured to control the supply of the lower-voltage to the boundary node in response to the input signal.

3. The level shifter of claim 2, wherein the lower-voltage control circuit logic circuitry comprises:
a NAND gate having a first input connected to the input node and an second input connected to the boundary node; and
a transistor having a gate connected to the output of the NAND gate.

4. The level shifter of claim 3, wherein the second input of the NAND gate is connected to the boundary node through an inverter.

5. The level shifter of claim 1, wherein the higher-voltage control circuit comprises logic circuitry configured to selectively supply a higher-voltage to the boundary node in response to the input signal.

6. The level shifter of claim 5, wherein the higher-voltage control circuit logic circuitry comprises:
a NAND gate having a first input connected to the input node and a second input connected to the boundary node;
a first transistor having a gate connected to an output of an inverter at the boundary node, and a source connected to a higher-voltage supply; and
a second transistor having a gate connected to an output of the NAND gate, a source connected to a drain of the first transistor, and a drain connected to the boundary node.

7. The level shifter of claim 1, wherein the level shifter comprises a plurality of inverters configured to transition the voltage level at the boundary node from the lower-voltage level to the higher voltage level, and wherein the boundary node is connected to an input of an inverter in the higher-voltage domain.

8. The level shifter of claim 7, wherein the lower-voltage control circuit is configured to disable a current path from the lower-voltage supply to the boundary node when the input signal is high.

9. A method of shifting a voltage level in a signal circuit from a lower voltage level to a higher-voltage level, said method comprising:
receiving an input signal into an input node in a lower-voltage domain having a lower-voltage level;
transitioning the input signal from the lower-voltage domain to a higher-voltage domain having a higher-voltage level; and
outputting an output signal in the higher-voltage domain that corresponds to the input signal,
wherein transitioning the input signal from the lower-voltage domain to the higher-voltage domain comprises shutting off a lower-voltage supply to a boundary node arranged between the lower-voltage domain and the higher-voltage domain in response to a high-level input signal,
wherein transitioning the input signal further comprises raising a voltage level of the boundary node to the higher-voltage level in response to the high-level input signal, and
wherein raising the voltage level of the boundary node comprises turning on a plurality of transistors arranged between a higher-voltage supply and the boundary node.

10. The method of claim 9, wherein shutting off the lower-voltage supply comprises turning off a transistor arranged between the lower-voltage supply and the boundary node using a combination of the input signal and a boundary node signal.

11. The method of claim 9, wherein raising the voltage level of the boundary node comprises using a boost capacitor to boost the voltage level of the boundary node.

12. An electronic system comprising:
a voltage level shifting circuit configured to transition a signal between a lower-voltage level domain and a higher-voltage level domain, said voltage level shifting circuit comprising:
an input node configured to receive an input signal in the lower-voltage domain;
an output node configured to output an output signal comprising a higher-voltage representation of the input signal in the higher-voltage domain;
a lower-voltage control circuit configured to selectively prevent a lower-voltage supply from supplying voltage of the lower-voltage level to a boundary node arranged at a boundary between the lower-voltage level domain and the higher-voltage level domain in response to a high-level input signal; and
a higher-voltage control circuit configured to selectively raise a voltage level at the boundary node in response to the high-level input signal,
wherein the higher-voltage control circuit comprises a boost capacitor configured to boost the voltage level at the boundary node in response to a high-level input signal.

13. The system of claim 12, wherein the lower-voltage control circuit comprises logic circuitry configured to control the supply of the lower-voltage to the boundary node in response to the input signal.

14. The system of claim 12, wherein the higher-voltage control circuit comprises logic circuitry configured to selectively supply a voltage at the higher-voltage level to the boundary node in response to the input signal.

15. The system of claim 12, wherein the voltage level shifting circuit comprises a plurality of inverters configured to transition the voltage level at the boundary node from the lower-voltage level to the higher-voltage level, and wherein the boundary node is connected to an input of an inverter in the higher-voltage level domain.

16. The system of claim 12, wherein the boost capacitor is connected between the output node and the boundary node.

* * * * *